(12) United States Patent
Mayer et al.

(10) Patent No.: US 8,816,406 B2
(45) Date of Patent: Aug. 26, 2014

(54) MATRIX CHARGE-TRANSFER IMAGE SENSOR WITH ASYMMETRIC GATE

(75) Inventors: Frederic Mayer, Saint Egreve (FR); Ray Bell, Middx (GB)

(73) Assignee: E2V Semiconductors, Saint-Égrève (FR)

( * ) Notice: Subject to any disclaimer, the term of this patent is extended or adjusted under 35 U.S.C. 154(b) by 0 days.

(21) Appl. No.: 13/698,318

(22) PCT Filed: May 5, 2011

(86) PCT No.: PCT/EP2011/057243
§ 371 (c)(1),
(2), (4) Date: Nov. 16, 2012

(87) PCT Pub. No.: WO2011/144459
PCT Pub. Date: Nov. 24, 2011

(65) Prior Publication Data
US 2013/0140609 A1 Jun. 6, 2013

(30) Foreign Application Priority Data
May 18, 2010 (FR) ...................................... 10 02086

(51) Int. Cl.
*H01L 27/148* (2006.01)
(52) U.S. Cl.
USPC ...................................................... 257/225
(58) Field of Classification Search
USPC ...................................................... 257/225
See application file for complete search history.

(56) References Cited

U.S. PATENT DOCUMENTS

| 4,779,124 | A | 10/1988 | Hynecek |
| 5,134,087 | A | 7/1992 | Hynecek |
| 6,465,820 | B1 | 10/2002 | Fox |
| 2009/0284632 | A1 * | 11/2009 | Onuki et al. .................. 348/302 |

FOREIGN PATENT DOCUMENTS

WO 2006073875 A2 7/2006

OTHER PUBLICATIONS

International Search Report dated May 5, 2011.

* cited by examiner

*Primary Examiner* — Timor Karimy
(74) *Attorney, Agent, or Firm* — Lowe Hauptman & Ham, LLP

(57) ABSTRACT

The invention relates to image sensors, more particularly but not exclusively to scanning sensors with signal integration (or TDI sensors, for 'Time Delay Integration linear sensors'). The adjacent pixels along a column each comprise an alternation of at least one photodiode and one storage gate adjacent to the photodiode. The gates comprise a main body and, on the upstream side in the direction of the transfer of the charges but not on the downstream side, a series of narrow fingers extending from the main body toward the upstream side, the ends of the fingers on the upstream side being adjacent to a photodiode situated upstream of the gate, the narrow fingers being separated from one another by doped isolating regions of the first type of conductivity, with a higher doping and preferably deeper than the surface regions, connected, as they are, to the reference potential of the active layer, these isolating regions being interposed between the main body of the gate and the photodiode. These fingers induce a directionality on the charge transfer.

18 Claims, 4 Drawing Sheets

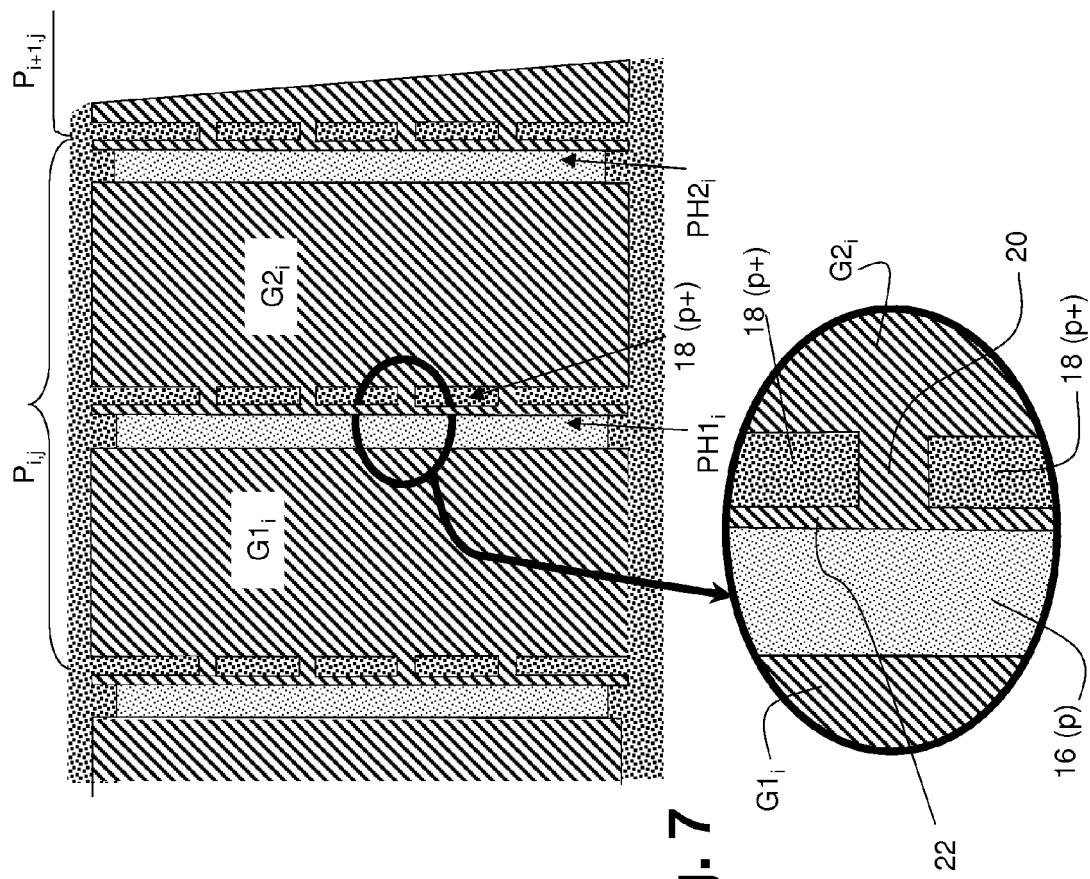

MATRIX CHARGE-TRANSFER IMAGE SENSOR WITH ASYMMETRIC GATE

RELATED APPLICATIONS

The present application is the U.S. National Stage of PCT/EP2011/057243, filed May 5, 2011, published in a Non-English language, which application claims priority benefit of FR 1002086 filed May 18, 2010

The invention relates to image sensors, more particularly but not exclusively to scanning sensors with signal integration (or TDI sensors, for 'Time Delay Integration linear sensors'), in which an image of a line of dots of an observed scene is reconstituted by addition of successive images taken by several photosensitive rows successively observing the same line of the scene as the scene passes in front of the sensor perpendicularly to the rows.

These sensors are used for example in systems for observation of the earth by satellite. They comprise several parallel rows of photosensitive pixels; the sequencing of the circuits controlling the various rows (control of exposure time then of reading the photogenerated charges) is synchronized with respect to the relative displacement of the scene and of the sensor, in such a manner that all the rows of the sensor see a single line of the observed scene. The signals generated are then added together dot by dot for each dot of the line observed.

The theoretical signal/noise ratio is improved in the ratio of the square root of the number N of rows of the sensor. This number can go from a few rows to a hundred or so depending on the applications (industrial control, earth observation, panoramic dental radiography or mammography).

In addition, the non-uniformities in sensitivity of the pixels of the same row bar, and the non-uniformities in dark current of the pixels, are reduced as a result of the averaging which results from the addition of the signals from the various rows.

In CCD image sensors (CCD: 'Charge-Coupled Device'), the addition of the signals dot by dot took place naturally and without read noise by transferring into a row of pixels the charges generated and accumulated in the preceding row of pixels, in synchronization with the relative displacement of the scene and of the sensor. The last row of pixels, having accumulated N times the charges generated by the observed image line, can be read.

The usual CCD image sensor technology uses high power supply voltages and has a high power consumption; this technology is based on the use of adjacent, mutually overlapping, polycrystalline silicon gates.

Image sensor technology has since been developed toward sensors using active pixels with transistors, which will henceforth be referred to as CMOS sensors for simplicity because they are, in general, fabricated using CMOS (complementary-metal-oxide-semiconductor) technology; in these CMOS sensors, there is no longer any transfer of charges from row to row to a read circuit or a register but there are active pixels with transistors which collect photogenerated electrical charges and convert them directly into a voltage or a current. The various rows of the sensor therefore successively supply voltages or currents representing the illumination received by the row. These structures do not allow summations of these currents or voltages to be carried out without noise; it is therefore difficult to produce a scanning sensor with charge integration. The fabrication technology is however simple, it has low power consumption, and it operates under a low voltage.

Attempts have however been made to produce CMOS scanning sensors with charge integration.

In particular, the use of switched capacitors has been tried in which successive currents received are integrated, thus accumulating charges received from several pixels in a column on the same capacitor (U.S. Pat. No. 6,906,749, WO0126382).

Another solution provided is to convert the signals coming from a row of pixels into digital values, to sum the digital value corresponding to the pixel of rank j of the row in an accumulator register of rank j which accumulates the digital values corresponding to the pixels of same rank j of N successive rows (patent FR2906080).

In patent FR2906081, the solution is to apply to the photodiode of a pixel of a row the output voltage of a pixel of a preceding row, in order to copy into it the charges from the preceding pixel, before isolating the photodiode and integrating new charges due to the light, such that, at the end of an integration time, the photodiode comprises the sum of the charges corresponding to the preceding row and the new integrated charges. This operation however leads to a transfer noise which deteriorates the signal/noise ratio.

Lastly, solutions using an accumulation of charges inside of the pixel have been provided, for example in patent publication US2008/0217661. They use a technology more complex than that which is strictly necessary for producing image sensors using CMOS technology, or else they exhibit losses during the transfer of charges.

The attempts to produce a linear scanning sensor with charge integration using a simpler technology than the usual CCD technology have not been very satisfactory.

It is important, in particular when sensors using charge transfer are used, for the transfer of charges from one pixel to the next pixel to be well controlled, avoiding the risk of a part of the charges going in the wrong direction. This can be achieved using pixels with a complex construction, i.e. with pixels controlled by three or four electrodes with three or four control phases. It would be desirable to be able to use pixels of simple construction and having only two control phases that are identical for all the pixels.

The aim of the invention is to provide a simple solution for producing sensors operating according to the principle of charge transfer structures, using only two control phases and using a technology compatible with CMOS technology circuits, notably a technology only using a single level of polycrystalline silicon gate for the storage gates or charge transfer gates, rather than a double level of mutually overlapping gates as is the case in conventional CCD technologies.

According to the invention, a charge transfer image sensor is provided, the sensor comprising N adjacent rows of P pixels, the adjacent pixels of same rank belonging to two consecutive rows each comprising an alternation of at least one photodiode and one storage gate adjacent to the photodiode, the gates covering an active layer region of a first type of conductivity (in practice p) and the photodiodes being formed within the active layer by an individual region of a second type of conductivity (n), itself covered by an individual surface region of the first type (p) connected to a reference potential of the active layer, characterized in that the gates comprise a main body and, on the upstream side in the direction of the transfer of the charges but not on the downstream side, a series of narrow fingers (20) extending from the main body toward the upstream side, the ends of the fingers on the upstream side being adjacent to a photodiode situated upstream of the gate, the narrow fingers being separated from one another by doped isolating regions of the first type of conductivity, with a higher doping (and preferably deeper) than the surface regions, connected, as the latter, to the reference potential of the active layer, these isolating regions being interposed between the main body of the gate and the photodiode such that the main body is not adjacent to the photodiode except at the end of the fingers.

The fingers are sufficiently narrow for the potential of the active layer under these fingers to be influenced by the presence of the doped isolating regions on either side of the fingers, in such a manner that the potential under the fingers is locally lower than under the main body of the gate despite the fact that the fingers are at the same potential as the main body of the gate.

A lower potential is understood to mean that a potential barrier is created within the active layer under the fingers with respect to the potential under the main body. This notion of potential barrier created by a lower potential refers to the fact that the stored charges are electrons. Indeed, for simplification (and because it is generally the case in practice) it will be assumed that the active layer is of the p type, that the charges photogenerated and stored under the gate are electrons and not holes, and consequently that a lower potential constitutes a potential barrier for electrons with respect to a higher potential.

In the following part of the description, it will be considered that the sensor is formed with an active layer of the p type, that the photodiodes store electrons in individual regions of the n type, and that the surface regions and the doped regions which separate the narrow fingers are of the p type.

By virtue of this gate configuration with fingers on the upstream side only, the charges stored under the gate of a pixel cannot flow toward the photodiode situated upstream, nor between the fingers of this gate due to the presence of the isolating regions, nor under these fingers because of the potential induced under the fingers by these regions; they can only flow toward a photodiode downstream of the storage gate, via the side of the gate which does not comprise any fingers; on this side, the gate is directly adjacent to the surface region p of the downstream photodiode. Conversely, the gate can receive charges coming from the photodiode situated immediately upstream, through the fingers whose ends are directly adjacent to the photodiode (as long as the potential barrier indicated hereinabove is not exaggeratedly high).

In a first embodiment, the fingers are completely separated from one another starting from the main body of the gate.

In a second embodiment, the ends of the fingers on the upstream side are connected to one another by sections of a narrow strip of gate used as an alignment mask for the implantation of the doped regions which form the photodiodes (and of the isolating regions which separate the fingers). In this case, almost all of the isolating regions are bounded by the lateral edges of two neighboring fingers, by a portion of the main body of the gate, and by a section of the narrow strip of gate.

The isolating regions are preferably regions implanted at the same time as the source and drain regions of the transistors which can be formed on the same integrated circuit as the matrix of pixels itself; they therefore have the same concentration of impurities and the same depth of implantation as these source and drain regions. As a result, the method of fabrication is simplified.

The image sensor is preferably a multilinear scanning sensor with charge integration but it may also be a matrix sensor supplying an image with N×P points. In the latter case, the charges must be rapidly extracted from the N×P pixels after each integration period and the illumination of the sensor preferably interrupted during this transfer.

BRIEF DESCRIPTION OF THE DRAWINGS

Other features and advantages of the invention will become apparent upon reading the detailed description that follows and which is presented with reference to the appended drawings in which:

FIG. 7 shows a top view of one variant embodiment of the gates of the pixel;

FIG. 8 shows one particular configuration of the fingers.

In FIG. 1, the general architecture of a charge transfer image sensor can be seen. The sensor comprises a matrix MT of N rows of P pixels sensitive to light. The charges resulting from the illumination of a pixel $P_{i,j}$ of rank i in a row and j in a column are integrated in the pixel over an integration time T; then they are transferred into the pixel of the next row of rank i+1 in a row and of same rank j in a column; the adjacent pixels in the column direction (vertical direction in the figure) are arranged as a vertical shift register with charge transfer.

The sensor can be a matrix sensor supplying successive images of N×P image dots or a multilinear sensor supplying linear images with P dots seen and accumulated by the N rows of pixels.

In the two cases, the pixels in a column behave as vertical shift registers but it is only in the second case that, on the one hand, the charges coming from a preceding pixel and, on the other hand, the charges photogenerated over an integration time T are accumulated in each pixel.

If the sensor is a matrix sensor designed to supply images of N×P pixels generated during an integration T, the charges of the N×P pixels are transferred after the time T; the transfer takes place from pixel to pixel in N steps to a horizontal read register RL or to a temporary storage matrix not shown, or again to circuits for charge/voltage conversion each assigned to a column of pixels; the read register RL can be a horizontal charge transfer register with P cells. For each new row, the read register RL directs the charges from the P cells toward a read circuit CL which converts them into a voltage.

If the sensor is a linear scanning sensor with charge integration, the charges contained in the N×P pixels are not read after each integration time T, but the charges read by the N pixels of a column are accumulated over N successive integration times, in synchronism with the scanning of the image in front of the sensor. Each of the N rows of pixels sees successively the same image line during the scanning of the image with respect to the sensor; the charges integrated within a row of rank i, which correspond to an observed image line, are added in the pixels of this row to the charges previously read by the i–1 preceding rows which have seen the same image line during the preceding integration times. At the end of N integration times, the last row of pixels contains the sum of the charges collected by all the rows which have seen the same image line. This row is read at the end of each time T by the register RL and the read circuit CL.

Figure 2:
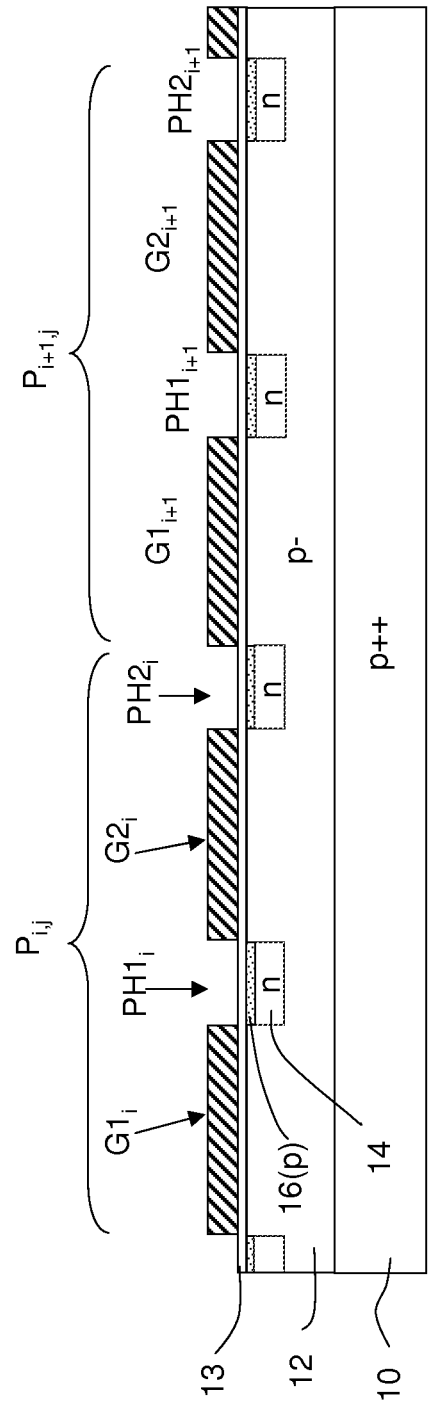
FIG. 2 shows a structure of adjacent pixels in a column composed of an alternation of storage gates and photodiodes.

The cross-sectional view in FIG. 2 shows a general structure of the pixels of one column of the matrix in a configuration where the pixels are composed of simple alternations of gates and photodiodes. This structure is a structure of principle based on which the invention will subsequently be more completely explained.

The pixels are formed within a semiconductor substrate 10 whose upper part is an active epitaxial semiconductor layer with light doping 12. In this example, the substrate is of the highly-doped p++ type, and the active epitaxial layer is of the p− type. If the epitaxial layer were of the n type, it would be necessary to invert all the types of conductivity, together with the signs of the potentials applied to the photodiodes and to the gates. The substrate is, in principle, of the same type of conductivity as the epitaxial layer, but it could also be of the opposite type.

The columns comprise a regular alternation of photodiodes and of charge storage gates. It may be considered by convention that a group of a photodiode and an adjacent storage gate constitutes either a half-pixel, or a complete pixel. In the first convention, a pixel comprises two photodiodes and two storage gates and all the pixels of the matrix are controlled with identical phases from one pixel to the other; in the second convention, a pixel comprises a single photodiode and a single storage gate, but two adjacent pixels of the same column are systematically controlled in phase opposition. In the following text, the first convention will be adopted and it will therefore be considered that a photodiode and an adjacent gate constitute a half-pixel, all the pixels of the sensor receiving the same control signals. Two adjacent pixels $P_{i,j}$ and $P_{i+1,j}$ are shown.

Each pixel therefore comprises two photodiodes PH1, PH2 and two charge storage gates G1, G2 alternated with the photodiodes. The photodiodes and gates are assigned indices i and i+1 in FIG. 2 for the pixels $P_{i,j}$ and $P_{i+1,j}$, respectively. The gates are made of polycrystalline silicon, insulated from the epitaxial layer 12 by a thin insulating layer 13 (silicon oxide or nitride). The photodiodes are formed by a stack comprising: the epitaxial layer 12 of the p type (common active layer for all the photodiodes of all the pixels), an individual region 14 of the n type diffused into the epitaxial layer between two transfer gates, and an individual surface region 16 of the p type, more doped than the epitaxial layer, covering the individual region 14. The electrons generated by the illumination will be able to be accumulated in potential wells formed at the junction between the n region and the p epitaxial layer.

The second photodiode $PH2_{i,j}$ of the pixel $P_{i,j}$ is immediately followed (in the direction of the charge transfer from left to right) by the first storage gate $G1_{i+1,j}$ of the next pixel $P_{i+1,j}$, and in a similar manner, the first transfer gate $G1_i$ of the pixel $P_{i,j}$ is immediately preceded by the second photodiode of the preceding pixel $P_{i-1,j}$.

In order to make a succession of pixels operate that are formed in such a simple manner by an alternation of gates and of photodiodes, the potentials of the photodiodes PH1 and PH2 and the potentials of the gates G1 and G2 should be individually controllable in order to:
  create within a pixel, under a gate or under a photodiode, potential wells for receiving newly generated charges and previously accumulated charges,
  raise the bottom of the potential wells at the end of an integration period so as to cause the transfer of the charges that they contain to the next pixel,
  create potential barriers on one side of the well but not on the other, at the time of the transfer, so that the transfer occurs exclusively in one direction.

It is easy to control the potential under the gates and to apply alternating potentials in phase opposition (high potential and low potential) to the gates G1 and G2; however, it is difficult to vary the potential of the photodiodes, especially as the potential of the surface regions 16 of the p type must remain at the reference potential of the active layer 12 during the charge integration. As a consequence of this difficulty, with the structure in FIG. 2, it is difficult to impose a direction of transfer onto the photogenerated charges.

For this reason, the invention provides for the pixels to have a particular configuration which ensures a directivity of the transfer without the need to act on the potential of the surface regions 16 of the p type during the transfer, and without the need for additional electrodes and additional control phases in the pixels.

Figure 4:
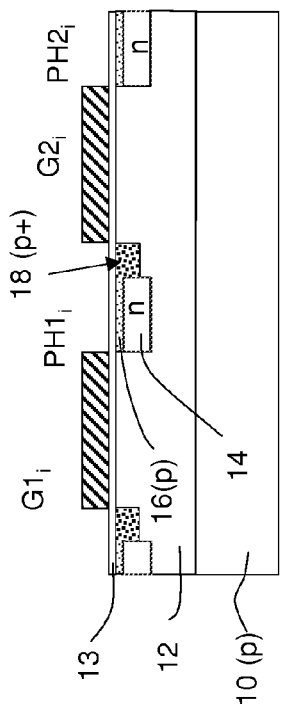
FIGS. 4 and 5 show vertical cross-sections along the lines IV-IV and V-V in FIG. 3.
Figure 5:
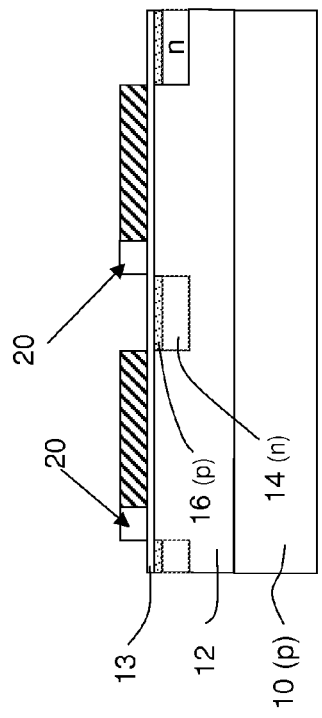
Figure 3:
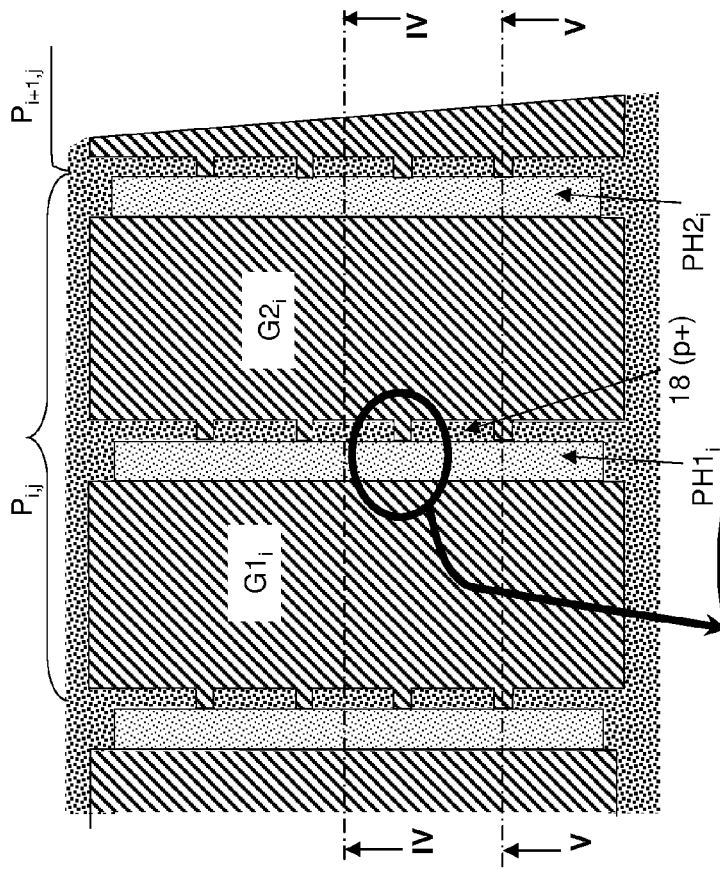
FIG. 3 shows a top view of a pixel according to the invention.

This configuration is shown in FIG. 3 (top view of a pixel $P_{i,j}$), FIG. 4 (cross-sectional view along the line IV-IV in FIG. 3), and FIG. 5 (cross-sectional view along the line V-V in FIG. 3).

The pixel again comprises an alternation of storage gates and photodiodes under the same conditions as those in FIG. 2. There is at least one storage gate and one photodiode per pixel, and the same convention as previously will be adopted, namely that a pixel comprises two half-pixels each having a storage gate adjacent to a photodiode.

From the top view, the gates of the pixels according to the invention are asymmetric; their side facing downstream in the direction of the transfer of the charges is different from the side facing upstream. The upstream direction is situated on the left, the downstream direction toward the right in FIG. 3.

On the upstream side, each gate $G1_i$, G2, comprises a series of narrow fingers 20 extending upstream starting from a main rectangular surface or main body of the gate. On the downstream side, the gates do not comprise any narrow fingers.

The cross-section in FIG. 4 is made at a place where there are no fingers; that in FIG. 5 is made where there are fingers.

The photodiodes are defined by the doped region 14 of the N type covered with a surface region 16 of the p type at the potential of the active layer 12 (and of the substrate 10); they are adjacent to the gate situated downstream of the photodiode at the end of the fingers 20 of this gate; however, they are not adjacent to the main surface of the gate; away from the end of the narrow fingers, the photodiodes are not adjacent to the gate and they are separated from it by doped isolating regions 18 of the p+ type, more doped than the surface regions 16 which cover the photodiodes. If the depth of the surface regions 16 is very limited, as is desired for improving the sensitivity in the blue, then the isolating regions 18 are preferably deeper than the regions 16.

On the downstream side of the gate, the photodiodes are adjacent to the main surface of the gate.

This arrangement of a gate with respect to a photodiode is applicable both for an adjacent gate and photodiode belonging to the same pixel and also for an adjacent gate and photodiode belonging to two neighboring pixels.

The doped isolating regions 18 are in the immediate proximity of the fingers on either side of the latter. They are at the reference potential in depth of the active layer 12, in other words (if the substrate is of the same type as the active layer) at the potential of the substrate 10 which is a reference potential for the whole of the matrix of pixels. This connection of the isolating regions 18 to the potential of the substrate here occurs perfectly naturally since the isolating regions 18 are p+ regions diffused into an active layer p itself in contact with the substrate p+.

In practice, if the sensor comprises circuits with PMOS transistors outside of the matrix of pixels, the isolating regions p+18 can be made at the same time as the p+ type source and drain regions of these transistors. They therefore have the same depth and the same concentration (both greater than those of the surface region). However, a specific implantation can be provided if it is preferred to adjust the depth and the concentration of the isolating regions 18 independently of the choices made for the transistor source and drain regions. These isolating regions 18 can also be made at the same time as other p+ regions, notably those that are used to laterally insulate the pixels belonging to different columns from one another, as has been shown in FIG. 3.

The width of the narrow fingers 20 in the direction perpendicular to the transfer of charges from a photodiode to a storage gate is sufficiently narrow and the doping of the regions 18 is sufficiently high for the potential of the upper part of the active epitaxial layer 12 under the fingers 20 to be influenced by the presence of the regions 18 on either side of the finger. In other words, under the main part of the gate, the potential in the active layer is of course influenced by the electrical potential applied to the gate, but under the fingers it is different because of the presence of the regions 18 situated on either side of the finger and because of the narrowness of the fingers, even though the fingers at the same potential as the main body of the gate.

In FIG. 4, the regions 18 can be seen, but not the fingers 20, since the cross-sectional plane does not go through the fingers; in FIG. 5 the fingers can be seen but not the regions 18 since there is no region 18 between a photodiode and a gate along the line of cross-section.

Figure 6:
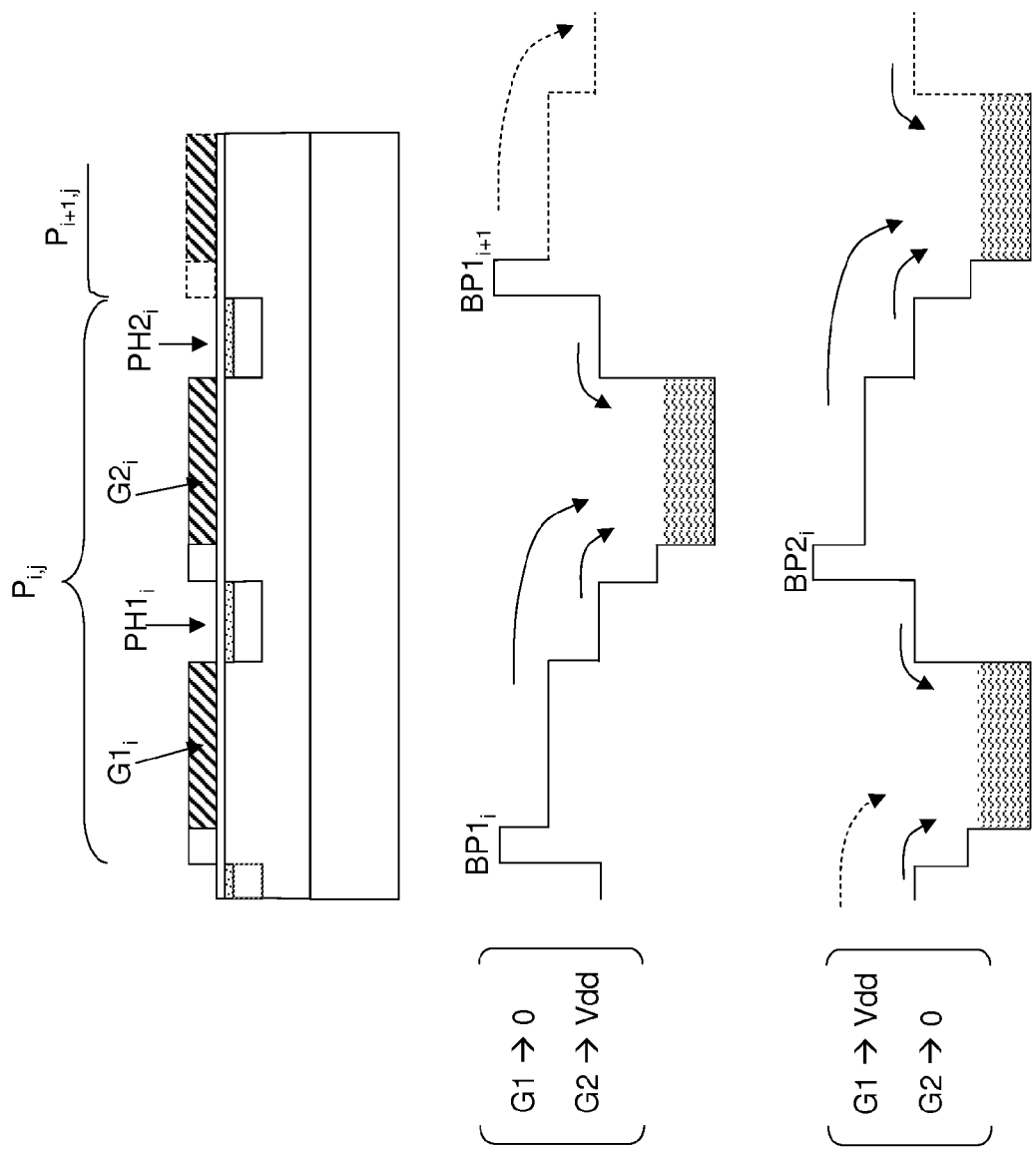
FIG. 6 shows a diagram of the potentials in the epitaxial layer of the substrate underneath a pixel according to the invention.

FIG. 6 shows a diagram of potentials inside the active layer, at a depth where the storage and the charge transfer are situated, in other words slightly below the top surface of the active layer. This figure is traced in the same cross-sectional plane as in FIG. 5, in other words at a place where there are fingers. The charge transfer only takes place under the fingers owing to the fact that the p+ regions 18 at the reference potential of the substrate create high potential barriers preventing any transfer of charges from a photodiode to a gate or vice versa.

The sensor operates with only two phases. All the gates G1 are connected at the same time and alternately receive a low potential, which is in principle the reference potential 0, and a high potential, which is in principle the power supply potential Vdd of the matrix of pixels. Vdd can be 5 volts. All the gates G2 are connected together so as to alternately receive this low potential and this high potential, but in phase opposition with the gates G1.

Two traces of potential are shown in FIG. 6; one corresponds to the first phase (gates G1 at the low potential, gates G2 at the high potential); the other corresponds to the second phase (G1 at the high potential, G2 at the low potential). The duration of each of the two phases is half of the integration period T corresponding to the observation of an image line by a row of pixels.

In accordance with the usual convention, the increasing potentials are directed downward so as to ensure that the potential wells and the potential barriers for the electrons are generated.

In the first phase of duration T, the potential induced under the gates G2 at Vdd is higher than that of the adjacent photodiodes and higher than that which is induced under the gates G1; the charges which were stored under the storage gate $G1_i$, at the end of the preceding integration period are transferred, at the beginning of the new integration period, under the storage gate G2i, through the photodiode $PH1_i$, since the gate $G1_i$ goes to 0 v, and through the fingers of the gate $G2_i$; the charges do not go through the isolating regions 18. The slight decrease in the potential under the fingers 20 of the gate $G1_i$, due to the proximity of the isolating regions 18 on either side of the fingers, creates a potential barrier $BP1_i$ upstream of the gate $G1_i$; this barrier $BP1_i$ prevents the charges situated under the gate $G1_i$, from leaving toward the left at the start of the phase. A total transfer of charges takes place toward the right, from the gates G1 to the gates G2, at the start of the first phase. Then, the charges generated by the light in the photodiode $PH1_i$, but also those that are generated in the photodiode $PH2_i$, are transferred under the storage gate $G2_i$, owing to the potential well created between the two photodiodes by the application of the potential Vdd onto the gate $G2_i$; the charges generated by the photodiode PH1, situated upstream of the gate $G2_i$, are transferred through the narrow fingers of the latter, the potential barrier locally induced under the fingers of the gate $G2_i$ being designed not to fall below the potential in the photodiode; the latter potential is defined by the doping profiles in the photodiode, given that the surface part 16 is held at the reference potential zero.

In the second phase, it is the gates G1 which go to Vdd before the gates G2 go to 0. The potential induced under the gates G1 becomes lower than that of the photodiodes and than that which is induced under the gates G2; the charges which were under the storage gate $G2_i$ at the end of the first phase are transferred, at the start of the new integration period, under the storage gate $G1_{i+1}$ of the next pixel, passing through the photodiode $PH2_i$ which is at an intermediate potential, and through the fingers of this gate $G1_{i+1}$. The slight fall in the potential under the fingers 20, due to the proximity of the regions 18 on either side of the fingers of the gate $G2_i$, creates a potential barrier $BP2_i$ upstream of the gate $G2_i$; this barrier prevents the charges situated under the gate $G2_i$ from leaving toward the left at the start of the phase. A total transfer of charges occurs here again toward the right, from the gates G2 toward the gates G1. Then, the charges generated by the light in the photodiode $PH1_i$ are transferred under the storage gate $G1_i$; the charges generated during the second phase by the other photodiode $PH2_i$ are transferred into the first gate of the next pixel through the fingers of the latter.

There is therefore both a unidirectional transfer of the charges toward the right, and a summation of the charges accumulated in a preceding pixel with the charges generated in the current pixel.

The simulations carried out show that the height of the potential barrier $BP1_i$, $BP2_i$, varies strongly with the width of the narrow fingers 20; typically it can vary by 0.5 volts to 2.5 volts for widths of fingers varying from 0.7 micrometer to 0.3 micrometer, these widths being easily achievable; these values are indicative because they depend on the etching technology and on the levels of implantation used. The height of the potential barrier must not however be too high in order not to prevent the transfer of charges from the photodiode toward the gate situated downstream during the integration period; this is because the barrier formed between the region situated under the main body of the gate and the region situated under the fingers also exists when the gates are at the potential Vdd and this barrier should not exceed the reference potential level of the photodiodes. A width of the fingers less than or equal to 0.4 micrometer is well suited.

In one variant embodiment shown in FIG. 7 as a top view, the ends of the fingers on the upstream side of the gate are connected to one another by sections 22 of a narrow strip of gate of polycrystalline silicon 22 used as an alignment mask for the implantation of the doped regions of the photodiodes and of the isolating regions 18. The isolating regions 18 are then bounded by the two fingers, by a portion of the main body of the gate, and by a portion of the narrow strip of gate. The surface area of the photodiodes is then better controlled, which is important for a better uniformity of response of the pixels of the matrix. The width of the sections 22 of narrow strip is preferably smaller than the width of the fingers so that the influence of the isolating regions 18 on the potential in the active layer is also exerted under this strip. The shape of the end of the finger can comprise an indentation at the point where the narrow strip meets the finger, as indicated in FIG. 8, in order to avoid risks of creation of undesirable pockets of potential under the fingers, in which pockets charges could remain trapped during the transfers.

The length of the fingers in the direction of the transfer can be substantially equal to their width.

It will be noted that the construction of the pixels with a photodiode between two storage gates allows a good response to be achieved in the blue wavelengths, the photodiode not being masked by a gate which absorbs the blue.

The sensor can be a thinned sensor illuminated via the back face, and the implantation depth of the surface regions of the photodiodes can then be increased without reducing the sensitivity in the blue. In this case, the depth of the implantations into the isolating regions 18 is not necessarily greater than the depth of the surface regions 16. Furthermore, for a sensor designed to take an image in the red, even if the sensor is not thinned, the surface regions 16 can be as deep as the isolating regions 18 because their depth does not then have much of a consequence for the sensitivity of the sensor.

Figure 1:
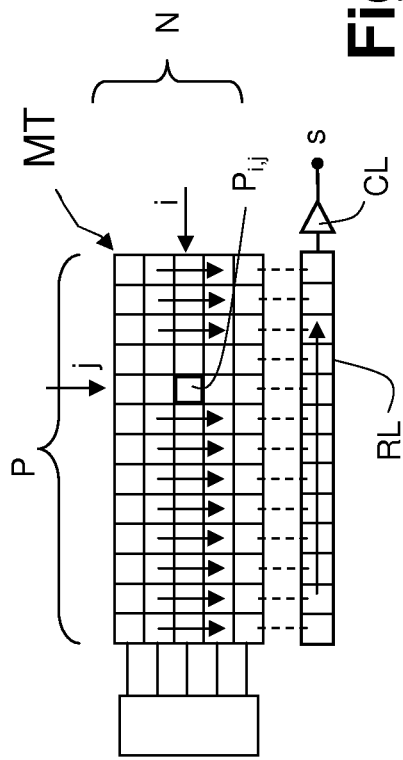
FIG. 1 shows the general structure of a matrix image sensor with charge transfer.

In the above, it has been considered that the charges are transferred at the end of a column into a read register with horizontal transfer of charges (register RL in FIG. 1). This register could also be replaced by a series of charge storage nodes and of charge-voltage conversion circuits (one charge storage node and one conversion circuit being associated with each column of the matrix). The conversion circuit comprises a few transistors, analogous to the transistors of an active pixel of a CMOS technology sensor, amongst which are a follower transistor and a reset transistor. The conversion circuit is then preferably associated with a correlated double-sampling circuit which firstly samples a reset potential level at the time of the reset of the potential of the charge storage node, then a useful signal level after transfer of charges from the last row of the matrix into the charge storage nodes. The difference of the two samples is converted by an analog-digital converter. An elementary converter can be provided for each column of pixels or else a global converter performs the conversion sequentially for each of the columns.

The invention claimed is:

1. A charge transfer image sensor, the sensor comprising N adjacent rows of P pixels, wherein adjacent pixels of same rank belonging to two consecutive rows each comprise an alternation of at least one photodiode and one gate adjacent to the at least one photodiode for transferring charges from one upstream pixel to an adjacent downstream pixel in a direction of transfer, the gates being placed above an active layer region of a first type of conductivity and the at least one photodiode being formed in the active layer by a superposition of an individual region of a second type of conductivity and, an individual surface region of the first type of conductivity connected to a reference potential of the active layer, wherein each gate comprises, as seen from above the active region, a main body and, on an upstream side in the direction of transfer but not on a downstream side in an opposite direction, a series of narrow fingers extending from the main body in a direction opposite to the transfer direction, the fingers having ends on the upstream side that are adjacent to a photodiode of the upstream pixel, the main body of the gate being adjacent to a photodiode of the downstream pixel, the narrow fingers being separated from one another by doped isolation regions of the first type of conductivity, with a higher doping than the surface regions and connected to the reference potential of the active layer, these isolation regions being interposed on the upstream side of the gate between the main body of the gate and the photodiode.

2. The image sensor as claimed in claim 1, wherein the isolation regions are deeper than the surface regions of the photodiodes.

3. The image sensor as claimed in claim 2, wherein the fingers are completely separated from one another starting from the main body of the gate.

4. The image sensor as claimed in claim 2, wherein the ends of the fingers on the upstream side are connected to one another by sections of a narrow strip of gate used as an alignment mask for an implantation of the photodiodes and of the isolation regions.

5. The sensor as claimed in claim 4, wherein the isolation regions are bounded by two fingers, by a portion of the main body of the gate, and by a section of the narrow strip of gate.

6. The sensor as claimed in claim 2, wherein the isolation regions of the first type of conductivity which separate the fingers are implanted with the same concentration and the same depth as transistor source and drain regions formed on the same integrated circuit as the matrix of pixels.

7. The image sensor as claimed in claim 2, further comprising scanning means for an observation of a same image line successively by several rows of pixels with a summation of electrical charges generated by an image dot in the pixels of same rank of the several rows, charges generated by an illumination of a pixel of rank i over an integration time being added to charges received from a pixel of preceding rank.

8. The image sensor as claimed in claim 1, wherein adjacent fingers are completely separated from one another starting from the main body of the gate.

9. The sensor as claimed in claim 8, wherein the isolation regions of the first type of conductivity which separate the fingers are implanted with the same concentration and the same depth as transistor source and drain regions formed on the same integrated circuit as the matrix of pixels.

10. The image sensor as claimed in claim 8, further comprising scanning means for an observation of a same image line successively by several rows of pixels with a summation of electrical charges generated by an image dot in the pixels of same rank of the several rows, charges generated by an illumination of a pixel of rank i over an integration time being added to charges received from a pixel of preceding rank.

11. The image sensor as claimed in claim 1, wherein the ends of the fingers on the upstream side are connected to one another by sections of a narrow strip of gate used as an alignment mask for an implantation of the photodiodes and of the isolation regions.

12. The sensor as claimed in claim 11, wherein the isolation regions are bounded by two fingers, by a portion of the main body of the gate, and by a section of the narrow strip of gate.

13. The image sensor as claimed in claim 12, further comprising scanning means for an observation of a same image line successively by several rows of pixels with a summation of electrical charges generated by an image dot in the pixels of same rank of the several rows, charges generated by an illumination of a pixel of rank i over an integration time being added to charges received from a pixel of preceding rank.

14. The sensor as claimed in claim 11, wherein the isolation regions of the first type of conductivity which separate the fingers are implanted with the same concentration and the same depth as transistor source and drain regions formed on the same integrated circuit as the matrix of pixels.

15. The image sensor as claimed in claim 11, further comprising scanning means for an observation of a same image line successively by several rows of pixels with a summation of electrical charges generated by an image dot in the pixels of same rank of the several rows, charges generated by an illumination of a pixel of rank i over an integration time being added to the charges received from a pixel of preceding rank.

16. The sensor as claimed in claim 1, wherein the isolation regions of the first type of conductivity which separate the fingers are implanted with the same concentration and the same depth as transistor source and drain regions formed on the same integrated circuit as the matrix of pixels.

17. The image sensor as claimed in claim 16, further comprising scanning means for an observation of a same image line successively by several rows of pixels with a summation of electrical charges generated by an image dot in the pixels of same rank of the several rows, charges generated by an illumination of a pixel of rank i over an integration time being added to charges received from a pixel of preceding rank.

18. The image sensor as claimed in claim 1, further comprising scanning means for observation of a same image line successively by several rows of pixels with a summation of electrical charges generated by an image dot in the pixels of same rank of the several rows, charges generated by an illumination of a pixel of rank i over an integration time being added to charges received from a pixel of preceding rank.

* * * * *